United States Patent
Reznicek et al.

(10) Patent No.: US 11,869,983 B2
(45) Date of Patent: Jan. 9, 2024

(54) LOW VOLTAGE/POWER JUNCTION FET WITH ALL-AROUND JUNCTION GATE

(71) Applicant: International Business Machines Corporation, Armonk, NY (US)

(72) Inventors: Alexander Reznicek, Troy, NY (US); Bahman Hekmatshoartabari, White Plains, NY (US); Karthik Balakrishnan, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/817,571

(22) Filed: Mar. 12, 2020

(65) Prior Publication Data
US 2021/0288187 A1 Sep. 16, 2021

(51) Int. Cl.
*H01L 29/808* (2006.01)
*H01L 29/10* (2006.01)
(Continued)

(52) U.S. Cl.
CPC .... *H01L 29/8086* (2013.01); *H01L 21/02576* (2013.01); *H01L 21/02579* (2013.01);
(Continued)

(58) Field of Classification Search
None
See application file for complete search history.

(56) References Cited

U.S. PATENT DOCUMENTS

| 7,687,335 | B2 | 3/2010 | Kapoor |
| 7,736,962 | B1 * | 6/2010 | Mori ................. H01L 29/66901 257/77 |

(Continued)

OTHER PUBLICATIONS

A. K. Kapoor, W. Zhang, S. Sonkusale, Y. Liu, P. Gregory, U. C. Sirdharan, C. Stager, N. Eib, Z. Xie, M. Vora, J. Prasad, D. Thummalapally, and R. Chou; Complementary logic with 60 nm poly gate JFET for 0.5 V operation, copyright The Institution of Engineering and Technology 2010, Mar. 18, 2010. See Electronics Letters, May 27, 2010, vol. 46, No. 11.

*Primary Examiner* — Khaja Ahmad
(74) *Attorney, Agent, or Firm* — Daniel Morris; Otterstedt & Kammer PLLC

(57) ABSTRACT

A Junction Field Effect Transistor (JFET) has a source and a drain disposed on a substrate. The source and drain have an S/D doping with an S/D doping type. Two or more channels are electrically connected in parallel between the source and drain and can carry a current between the source and drain. Each of the channels has two or more channel surfaces. The channel has the same channel doping type as the S/D doping type. A first gate is in direct contact with one of the channel surfaces. One or more second gates is in direct contact with a respective second channel surface. The gates are doped with a gate doping that has a gate doping type opposite of the channel doping type. A p-n junction (junction gate) is formed where the gates and channel surfaces are in direct contact. The first and second gates are electrically connected so a voltage applied to the first and second gates creates at least two depletion regions in each of the channels. In some embodiments, the junction gates are formed all-around the channel surfaces. As a result, the current flowing in the channels between the source and drain can be controlled with less voltage applied to the gates and less power consumption.

14 Claims, 12 Drawing Sheets

(51) Int. Cl.
  *H01L 21/02* (2006.01)
  *H01L 29/06* (2006.01)
  *H01L 29/08* (2006.01)

(52) U.S. Cl.
  CPC ...... *H01L 29/0661* (2013.01); *H01L 29/0665* (2013.01); *H01L 29/0847* (2013.01); *H01L 29/1045* (2013.01); *H01L 29/1066* (2013.01)

(56) References Cited

U.S. PATENT DOCUMENTS

| | | |
|---|---|---|
| 8,253,168 B2 | 8/2012 | Miller et al. |
| 9,076,662 B2 | 7/2015 | El-Kareh et al. |
| 9,647,098 B2 | 5/2017 | Obradovic et al. |
| 9,876,066 B2 | 1/2018 | Zhang et al. |
| 9,991,254 B1 | 6/2018 | Cheng et al. |
| 9,991,261 B2 | 6/2018 | Mitard |
| 10,056,379 B1 | 8/2018 | Balakrishnan et al. |
| 2002/0105024 A1* | 8/2002 | Fujihira ............. H01L 29/7835 257/E29.279 |
| 2003/0168704 A1* | 9/2003 | Harada ............... H01L 29/1066 257/E29.104 |
| 2006/0202238 A1* | 9/2006 | Fujikawa .......... H01L 29/42316 257/270 |
| 2012/0211806 A1* | 8/2012 | Werner ............ H01L 29/42316 257/263 |
| 2013/0001656 A1* | 1/2013 | El-Kareh .......... H01L 29/66901 257/263 |
| 2015/0054038 A1* | 2/2015 | Masliah ............. H01L 29/7832 257/262 |
| 2016/0276339 A1* | 9/2016 | Titus ................. H01L 27/0705 |
| 2017/0236901 A1* | 8/2017 | Choi ................. H01L 21/3065 257/347 |
| 2019/0221638 A1 | 7/2019 | Reznicek et al. |
| 2019/0288111 A1* | 9/2019 | Eklund ............... H01L 29/7816 |

* cited by examiner

LOW VOLTAGE/POWER JUNCTION FET WITH ALL-AROUND JUNCTION GATE

BACKGROUND

The present invention relates to an improved Junction Field Effect Transistor (JFET). More specifically, the invention relates to a low power/voltage FET with an all-around gate.

JFETs have the benefit of low noise and high input impedance compared to Metal Oxide Semiconductor FETs (MOSFETs). Due to their low noise operation, JFETs are circuit building blocks with a critical use in analog electronics. Some uses of JFETs include low noise ring oscillators, memory devices, operational amplifiers (with high input-impedance and very high current-gain), and high precision computation circuits.

Emerging mobile and Internet of Things (IoT) applications need low power devices, e.g. devices that operate at lower voltages and currents. These technologies also would benefit from the low noise and high input impedance that JFET devices provide.

Further, there is a renewed interest in the analog implementation of neural networks. These applications need efficient/low-power hardware implementations of computationally intensive cognitive tasks such as pattern recognition and natural language processing.

There is a need for JFETs that operate with lower input voltage and low input power consumption.

SUMMARY

Embodiments of the present invention include a Junction Field Effect Transistor (JFET) with a source and a drain disposed on a substrate. The source and drain have the same S/D doping with an S/D doping type.

Two or more channels are electrically connected in parallel between the source and drain and carry a current between the source and drain. Each of the channels has two or more channel surfaces. The channel has a channel doping with a channel doping type, where the channel doping type is the same as the S/D doping type.

A first gate is in direct contact with one of the channel surfaces, a first channel surface. The first gate has a gate doping with a gate doping type. One or more second gates is in direct contact with a respective second channel surface, each second channel surface is another of the channel surfaces. The first and second gates are doped with a gate doping with a gate doping type that is opposite the channel doping type. A p-n junction (junction gate) is formed where one of the gates is in direct contact with one of the channel surfaces.

The first and second gates are electrically connected so a voltage applied to the gates creates at least two depletion regions in each of the channels. As a result, the current flowing in the channels between the source and drain can be controlled with less voltage applied to the gates and therefore less power consumption. Methods of making JFET structures are disclosed.

BRIEF DESCRIPTION OF THE DRAWINGS

Various embodiments of the present invention will be described below in more detail, with reference to the accompanying drawings, now briefly described. The Figures show various apparatus, structures, and related method steps of the present invention.

DETAILED DESCRIPTION

Figure 1:
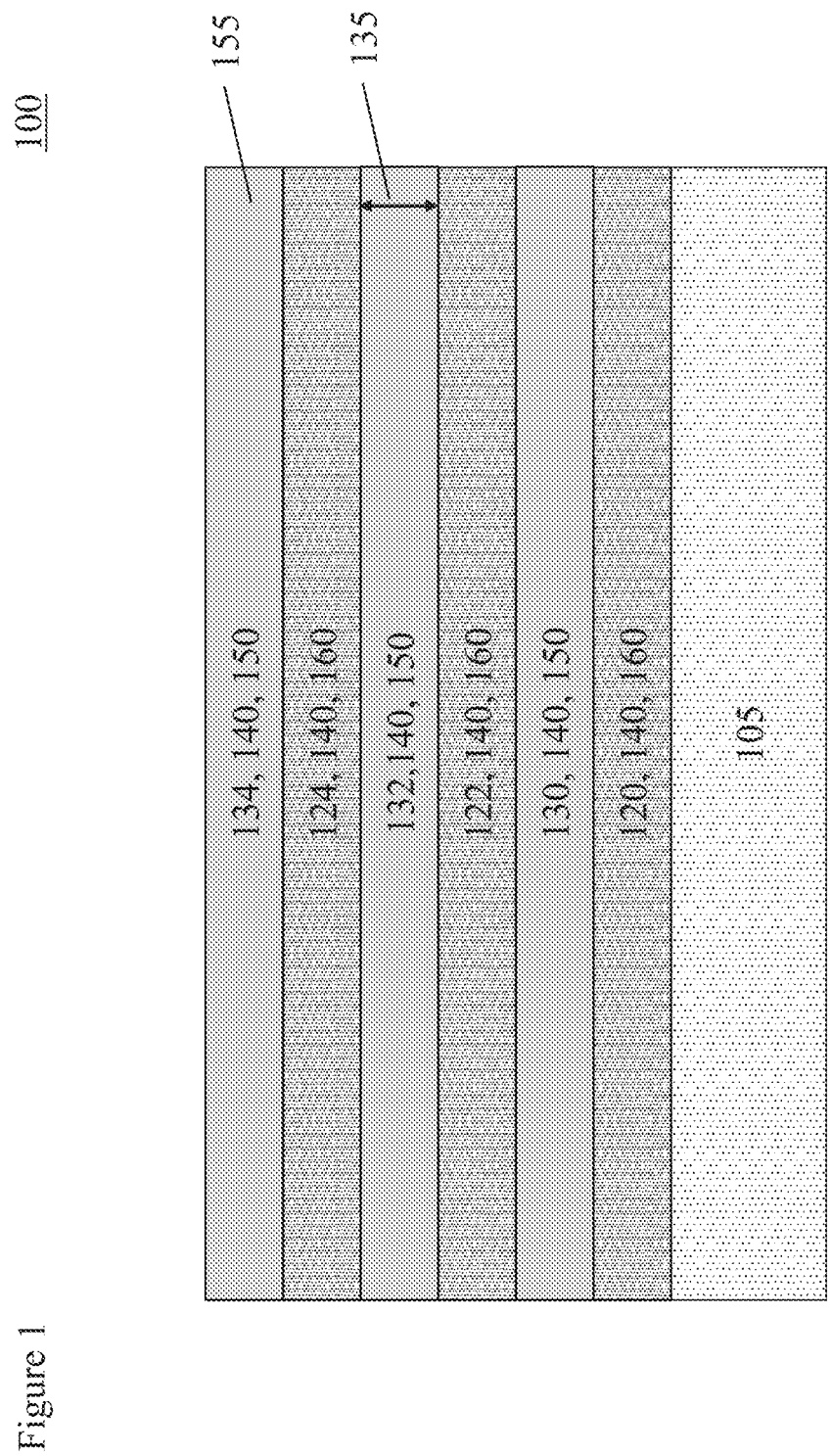
FIG. 1 is a cross-section view of an interim layered structure.

It is to be understood that embodiments of the present invention are not limited to the illustrative methods, apparatus, structures, systems and devices disclosed herein but instead are more broadly applicable to other alternative and broader methods, apparatus, structures, systems and devices that become evident to those skilled in the art given this disclosure.

In addition, it is to be understood that the various layers, structures, and/or regions shown in the accompanying drawings are not drawn to scale, and that one or more layers, structures, and/or regions of a type commonly used may not be explicitly shown in a given drawing. This does not imply that the layers, structures, and/or regions not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures may not be repeated for each of the drawings.

The semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, neural networks, etc. Systems and hardware incorporating the semiconductor devices and structures are contemplated embodiments of the invention.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used herein, "lateral," "lateral side," "side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

The Figures present a series of interim structures leading to different embodiments of a Junction Field Effect Transistor (JFET) created by various method steps. The JFET has two or more channels electrically connected in parallel between a single source and a single drain. One or more of the channels has an upper junction gate formed when an upper gate is in direct contact with an upper surface of the respective channel and a lower junction gate formed when a lower gate is in direct contact with a lower surface of the respective channel. The gates form a p-n junction at each surface where the gates and channels are in direct contact.

Various embodiments of "all-around" gates are possible. For example, the all-around gates can be gates in direct contact with a top and bottom surfaces of a channel. In other embodiments, the all-around gate surrounds and is in direct contact with more than two, or all, of the channel surfaces (e.g., top, bottom, front, and back).

In some embodiments, the upper and lower gates on a channel are electrically connected so the "all-around" junction gate applies the same electric field on the upper and lower regions of the channel. Where the all-around gate surrounds all the surfaces of the channel (top, bottom, front, and back) the all-around gate can be one a single unified structure that applies the electric field to all surface (junctions) of the channel.

In some embodiments, the gates of all of each of the individual parallel channels are electrically connected or are one unified structure surrounding and in direct contact with all the individual parallel channels on multiple channel sides/surfaces.

When a gate voltage biases the gate(s), depletion regions develop at all junction gates (p-n junctions) surrounding the channel(s), e.g. on the upper and lower surfaces (and in some embodiments on the front and back) of the channels, respectively.

As a result, with all other factors being equal, the device pinch-off voltage, $V_p$, is greatly reduced compared to a device with a single junction gate per channel. (The pinch-off voltage, $V_p$, is defined as the minimum gate-source voltage, $V_{GS}$, required to fully deplete the channel, and thus turn off current flow, through the channel.) In addition, the $V_{GS}$ range needed to control current flow through the JFET (other than turning the current completely on and off) is also reduced.

Total current flowing through the device, including "on" current, is increased by increasing the number of channels connected in parallel between the same source and drain (S/D). Where the all-around gates of two or more of the channels are electrically connected, the increased current is control by a single gate-source voltage connection.

Since the $V_{GS}$ needed to control the device is reduced, the overall input power needed to control the device is reduced accordingly. In some embodiments, with all other factors being equal, the $V_{GS}$ is one half or less of the voltage required to perform the same operation in a device with a single junction gate per channel.

Refer now to the Figures.

FIG. 1 is a cross-section view of an interim layered structure 100. The beginning structure 100 is a layer of nanosheets disposed on a substrate 105. Each nanosheet (120, 130, 122, 132, 124, and 134, typically 140) is either a channel layer (130, 132, and 134, typically 150) or an all-around dummy gate layer (120, 122, 124, typically 160). The channel layers 150 and all-around dummy gate layers 160 alternate, one disposed on the other, to form the layers of nanosheets 140.

The substrate 105 can be made from a single element (e.g., silicon or germanium), primarily a single element (e.g., with doping), for example silicon, or a compound semiconductor, for example, gallium arsenide (GaAs), or a semiconductor alloy, for example silicon-germanium (SiGe). In some embodiments, the substrate 105 includes one or more semiconductor materials including, but not limited to, silicon (Si), SiGe, Si:C (carbon doped silicon), germanium (Ge), carbon doped silicon germanium (SiGe:C), Si alloys, Ge alloys, III-V materials (e.g., GaAs, Indium gallium arsenide (InGaAs), indium arsenide (InAs), indium phosphide (InP), aluminum arsenide (AlAs), etc.), II-V materials (e.g., cadmium selenide (CdSe), cadmium sulfide (CdS), or any combination thereof) or other like semiconductors. In addition, multiple layers of the semiconductor materials can be used as the semiconductor material of the substrate 105. In some embodiments, the substrate 105 includes both semiconductor materials and dielectric materials. In some silicon on insulator (SOI) implementations, a buried oxide layer, BOX, (e.g., SiO2) is buried in the substrate 105.

The channel layers 150 are made of semiconductor material. In some embodiments, the channel layers are made of the same material as the source and drain (S/D), described below. In some embodiments the channel layers 150 are made of silicon (Si).

The channel layers 150 have the same type of doping as the S/D, however, the doping levels (typically 155) of the channel layers 150 are lower than the doping levels of the S/D. (See a more detailed description of the S/D, below.)

If the S/D and channel layers 150 are p-type doped, dopants can be selected from a non-limited group of boron (B), gallium (Ga), indium (In), and thallium (Tl). If the S/D and channel layers 150 are n-type doped, dopants can be selected from a non-limited group of phosphorus (P), arsenic (As) and antimony (Sb).

In some embodiments, the channel layers 150 are doped between $1 \times 10^{19}$ cm$^{-3}$ and $3 \times 10^{20}$ cm$^{-3}$ and the channel layer 150 thicknesses range between 5 and 30 nanometers (nm). More details about the channel layer 150 doping and thickness, typically 135, is provided below. Other doping levels and thicknesses are possible.

The all-around dummy gate layers 160 are made of sacrificial material that can be removed by processes that do not affect other materials of the structure 100, e.g. materials making the substrate 105 and channel layers 150. In some embodiments, the all-around dummy gate layers 160 are made of silicon-germanium (SiGe).

The thickness of the all-around dummy gate layers 160 is between 6 nm and 20, with 8-10 nm preferred. Other thicknesses are possible.

In some embodiments, the nanosheet layers 140 are epitaxially grown on top of one another. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, each semiconductor layer of the epitaxial semiconductor material stack has the same crystalline characteristics as the deposition surface on which it is formed.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C.

In some embodiments, the gas source for the epitaxial growth may include a silicon containing gas source and/or an admixture of a germanium containing gas source. Examples of silicon gas sources include silane, disilane, trisilane, tetrasilane, hexachlorodisilane, tetrachlorosilane, dichlorosilane, trichlorosilane, and combinations thereof. Examples of germanium gas sources include germane, digermane, or combinations thereof. In some embodiments, an epitaxial SiGe alloy can be formed from a source gas that includes a compound containing silicon and germanium. Carrier gases like hydrogen, nitrogen, helium and argon can be used. For the epitaxial growth of a layer an appropriate type dopant is added to the precursor gas or gas mixture. In some embodiments of channel material layers, no dopant is typically present in, or added into, the precursor gas or gas mixture.

In a preferred embodiment, layers 140 are grown by an integrated epitaxy process. In an integrated epitaxy process the structure is epitaxially grown continuously while the type of gas source and type and/or the concentration of dopants changes at different times and time periods to create the different layers with different dopants and dopant concentrations. Some temperature adjustments may be made for one or more of the layers during the epitaxial growth as well.

The nanosheet layers 140 are grown on top of one another as described below to complete the structure 100. The grown channel layers 150 can be in-situ doped, meaning dopants are incorporated into the epitaxy layers during the growth/deposition of the respective epitaxial layer 140. Other alternative doping techniques can be used, including but not limited to, ion implantation, gas phase doping, plasma doping, and plasma immersion ion implantation, etc.

In some embodiments, the source gas is changed to create the all-around dummy gate layers 160. The all-around dummy gate layers 160 are not doped.

In some embodiments, 2 or 3 channel layers 150 are formed. Formation of more channel layers 150 is possible.

Creating the structure 100 by epitaxial growing nanolayers 140 allows for accurate control of nanolayer 140 thickness and doping levels. Further, there is no alignment of layers needed during the nanolayer 140 growth.

Figure 2:
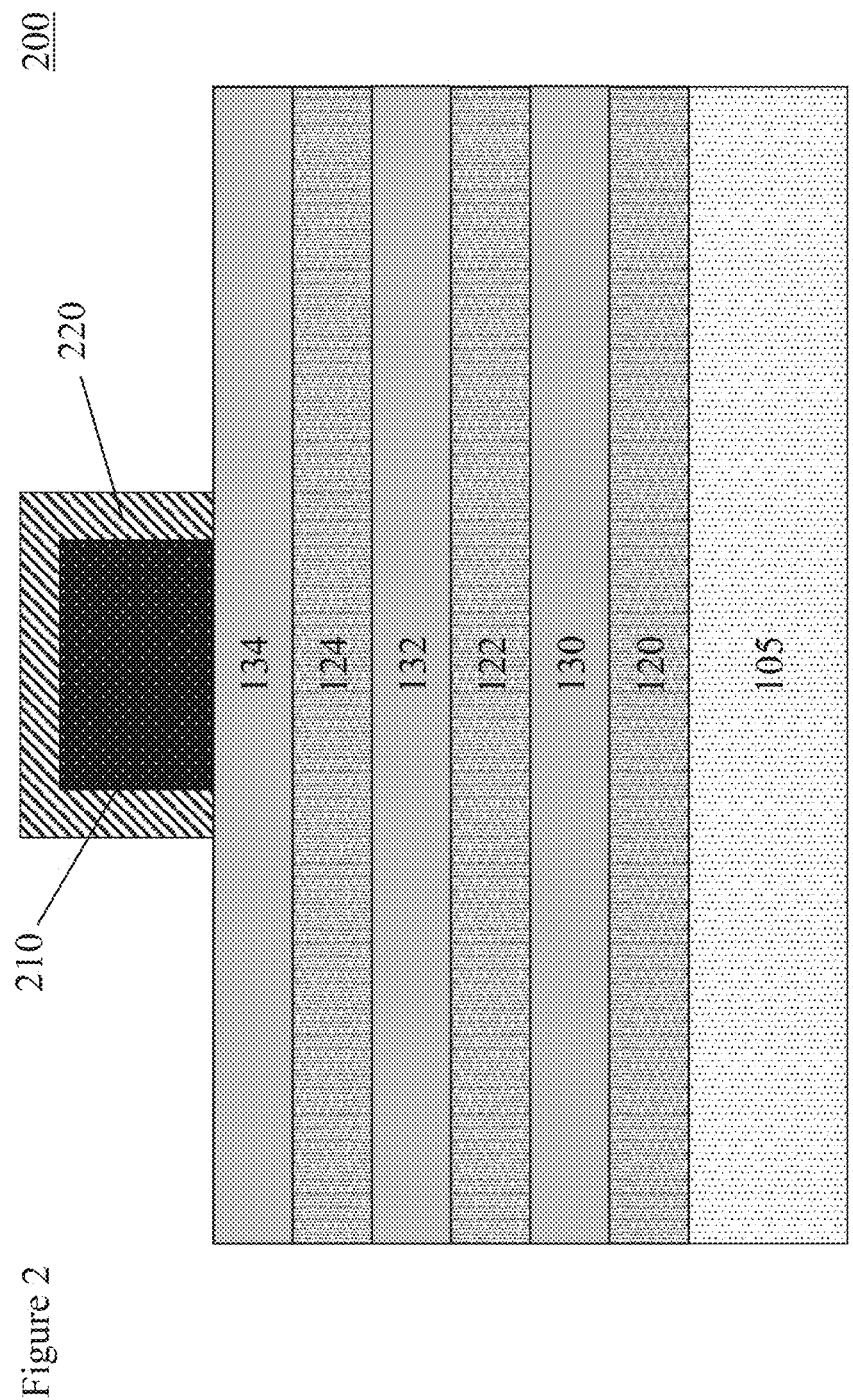
FIG. 2 is the cross-section view of a top dummy gate and a top gate spacer disposed on the interim structure of FIG. 1.

FIG. 2 is the cross-section view 200 of a dummy gate 210 and gate spacer 220 disposed on the interim structure of FIG. 1.

The dummy gate 210 and gate spacer 220 are formed by well-known methods. For example, the dummy gate material 210 is deposited through a mask. After mask removal the gate spacer material 220 is conformally deposited and a directional etch back is performed. The dummy gate 210 is made of a sacrificial material that is selectively different chemically from the gate spacer 220 material.

The dummy gate 210 material can include, for example, amorphous silicon (α-Si) or polycrystalline silicon (polysilicon). In some embodiments, the dummy gate material is the same material as the same material as the all-around dummy gate layers 160, e.g. SiGe. The dummy gate 210 material may be deposited by a deposition process, including, but not limited to, physical vapor deposition (PVD), chemical vapor deposition (CVD), and plasma enhanced chemical vapor deposition (PECVD). The dummy gate 210 has a thickness of about 10 nm to about 100 nm, or 20 nm to 50 nm. Other thicknesses are possible.

The gate spacer 220 material can be deposited by known techniques like PVD, CVD, or atomic layer deposition (ALD) and can be made of materials like silicon nitride (SiN), silicon boron nitride (SiBN), siliconborocarbonitride (SiBCN), silicon oxycarbonitride (SiOCN), dielectric oxynitrides, or dielectric oxides like silicon oxide (SiOx). The thickness of the gate spacer 220 can be between 3 nm to 15 nm, although other thicknesses are possible. In some embodiments, the gate spacer 220 is SiN.

Figure 3:
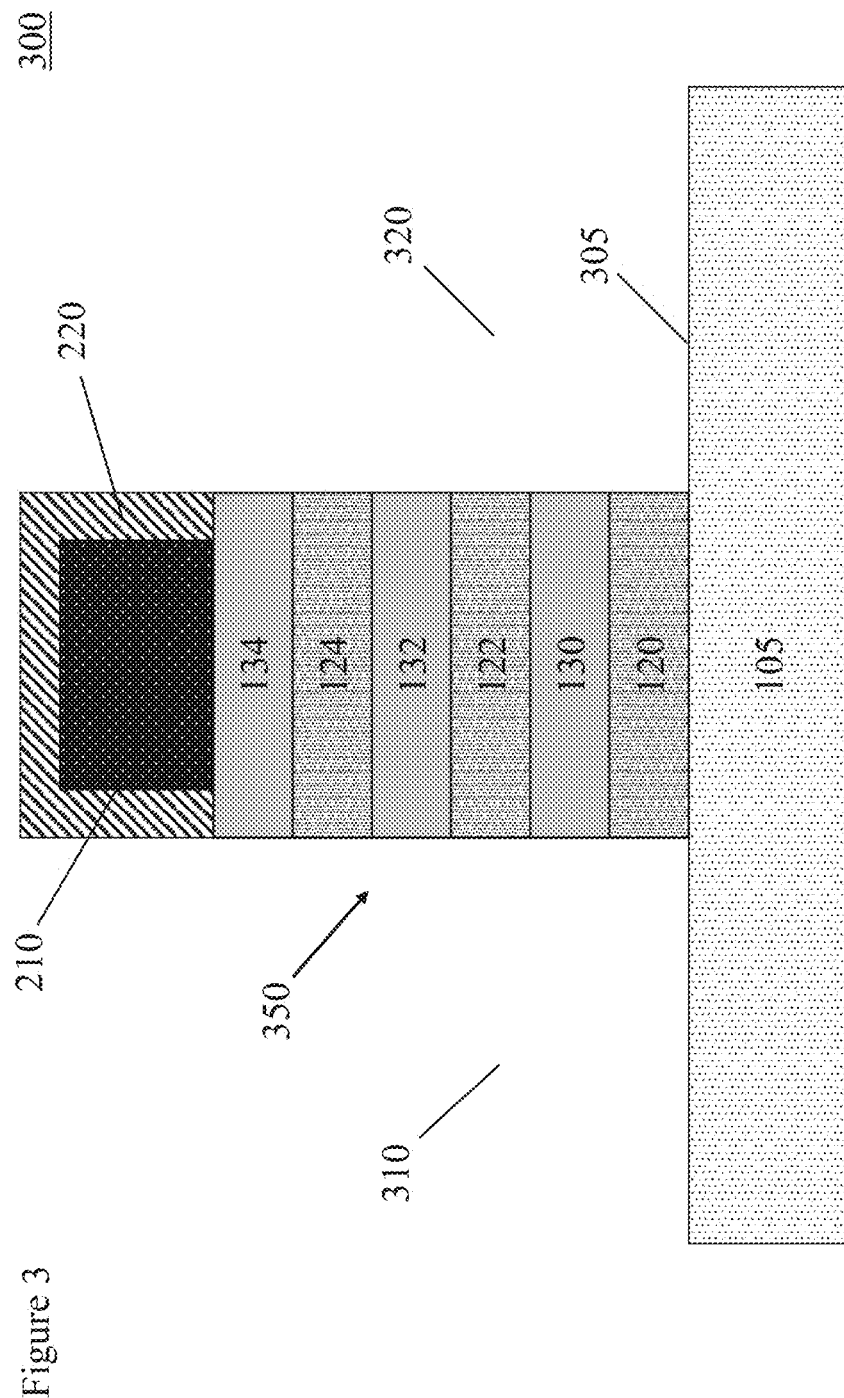
FIG. 3 is a cross-section view of an interim structure with regions removed to enable growth of a source and drain.
Figure 5:
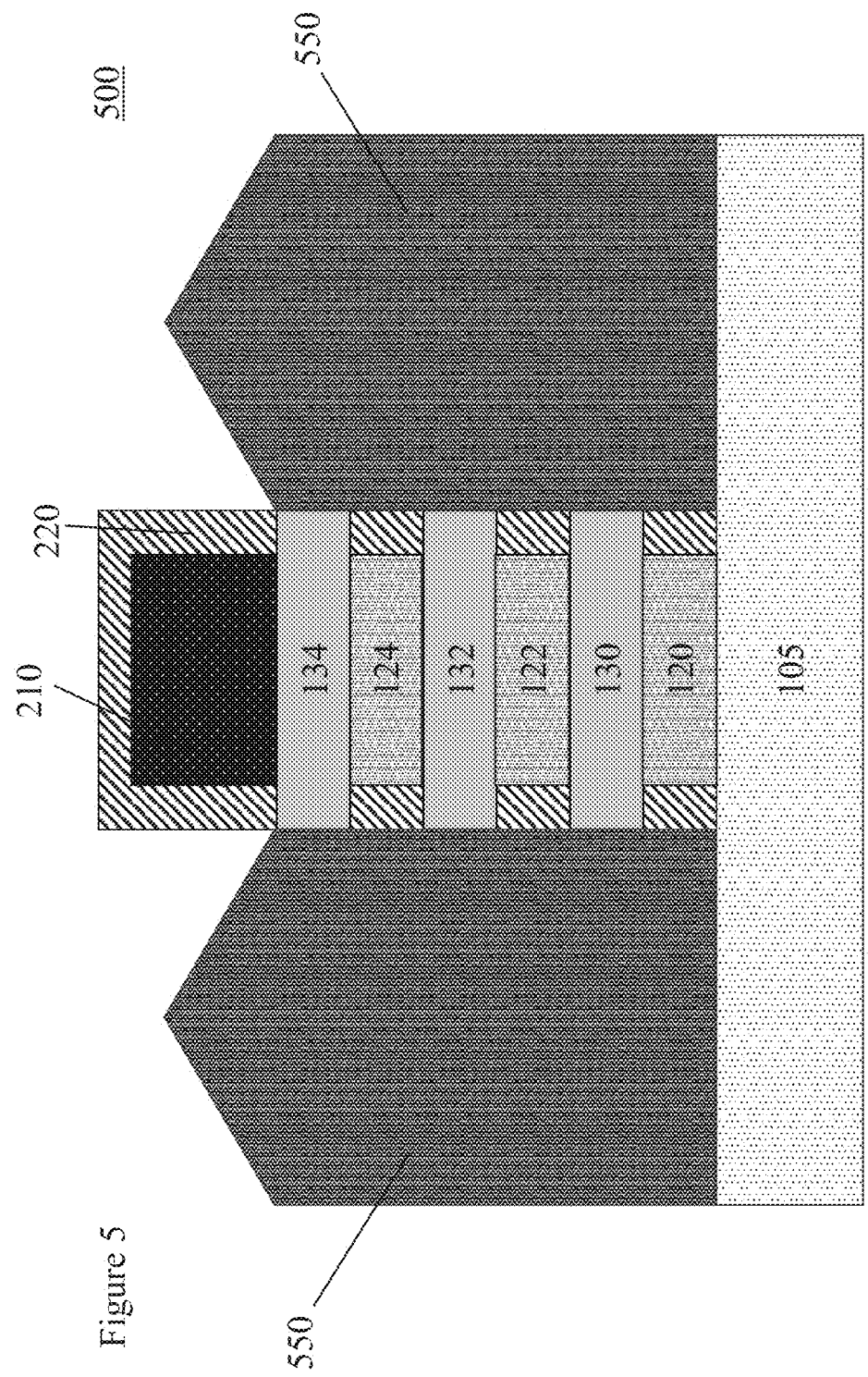
FIG. 5 is a cross-section view of an interim structure after the source and drain are epitaxially grown.

FIG. 3 is a cross-section view of an interim structure 300 with regions (310, 320) removed to enable growth of a source and drain, shown in FIG. 5.

In some embodiments, the gate spacer 220 is used as a masked in a direction reactive ion etch (RIE) process that etches the nanolayers 140 away in regions 310 and 320 while leaving a stack 350 of the nanolayers 140 under the gate spacer 220. In some embodiments, the RIE etching is a series of different RIEs as required for the chemistry of the layer 140 being removed. The RIE stops when the surface 305 of the substrate 105 is reached, using known techniques like end point detection, i.e. monitoring when the material of the last removed layer 120 stops being detected.

Figure 4:
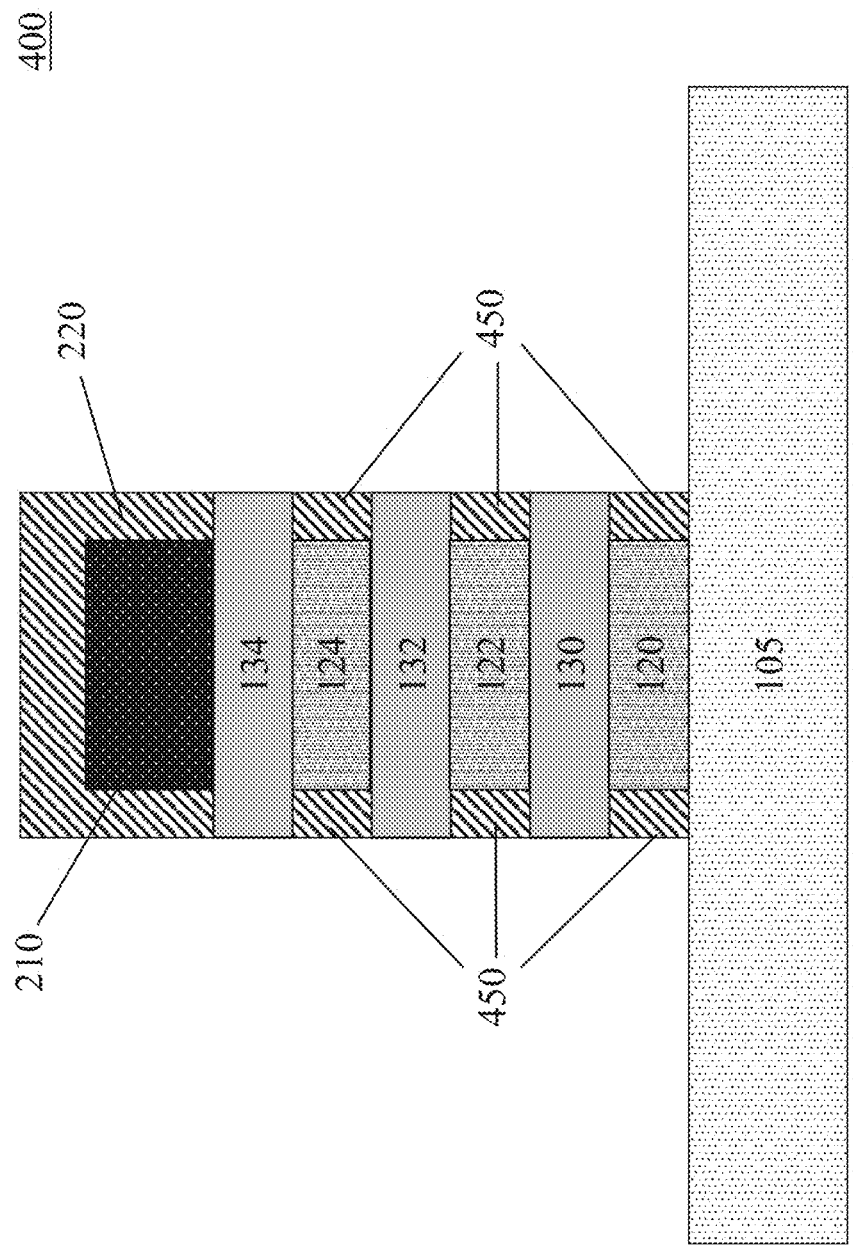
FIG. 4 is a cross-section view of an interim structure with inner spacers formed.

FIG. 4 is a cross-section view of an interim structure 400 with inner spacers 450 formed.

Inner spacer 450 formation begins with a partial etch back of the all-around dummy gate layers 160. The etching chemistry selectively removes the material, e.g. SiGe, in the all-around dummy gate layers 160 and does not affect the materials in channel layers 150 or the gate spacer 220. For example, the structure is exposed for a timed period to known chemistries like a hydrofluoric acid (HF) solution, an ammonium hydroxide (NH$_4$OH) solution at higher than room temperature, or dry chemical oxide etch. Then the inner spacer 450 material is conformally deposited. Known processes (e.g. a masked directional etch) re-define the sides of the stack 350 and remove spacer material from the surface 305 of the substrate 105.

Inner spacer 450 materials and deposition techniques can be those used in formation of the gate spacer 220. In some embodiments, the inner spacers 450 are made of silicon nitride (SiN). The thickness of the inner spacers 450 is between 3 nm and 8 nm. Other thicknesses are possible.

FIG. 5 is a cross-section view of an interim structure 500 after the source and drain (S/D) 550 are epitaxially grown. Known epitaxially growth and doping methods, as described above, are used to grow the S/D 550.

Both S/Ds 550 have the same doping type. Except in cases where the channel layers 150 are undoped, the S/Ds 550 also will the same doping type as the channel layers 150. The S/Ds 550 are doped at levels between $4\times10^{20}$ cm$^{-3}$ and $2.5\times10^{21}$ cm$^{-3}$. In some embodiments, the S/Ds 550 are made of doped SiGe.

Figure 6:
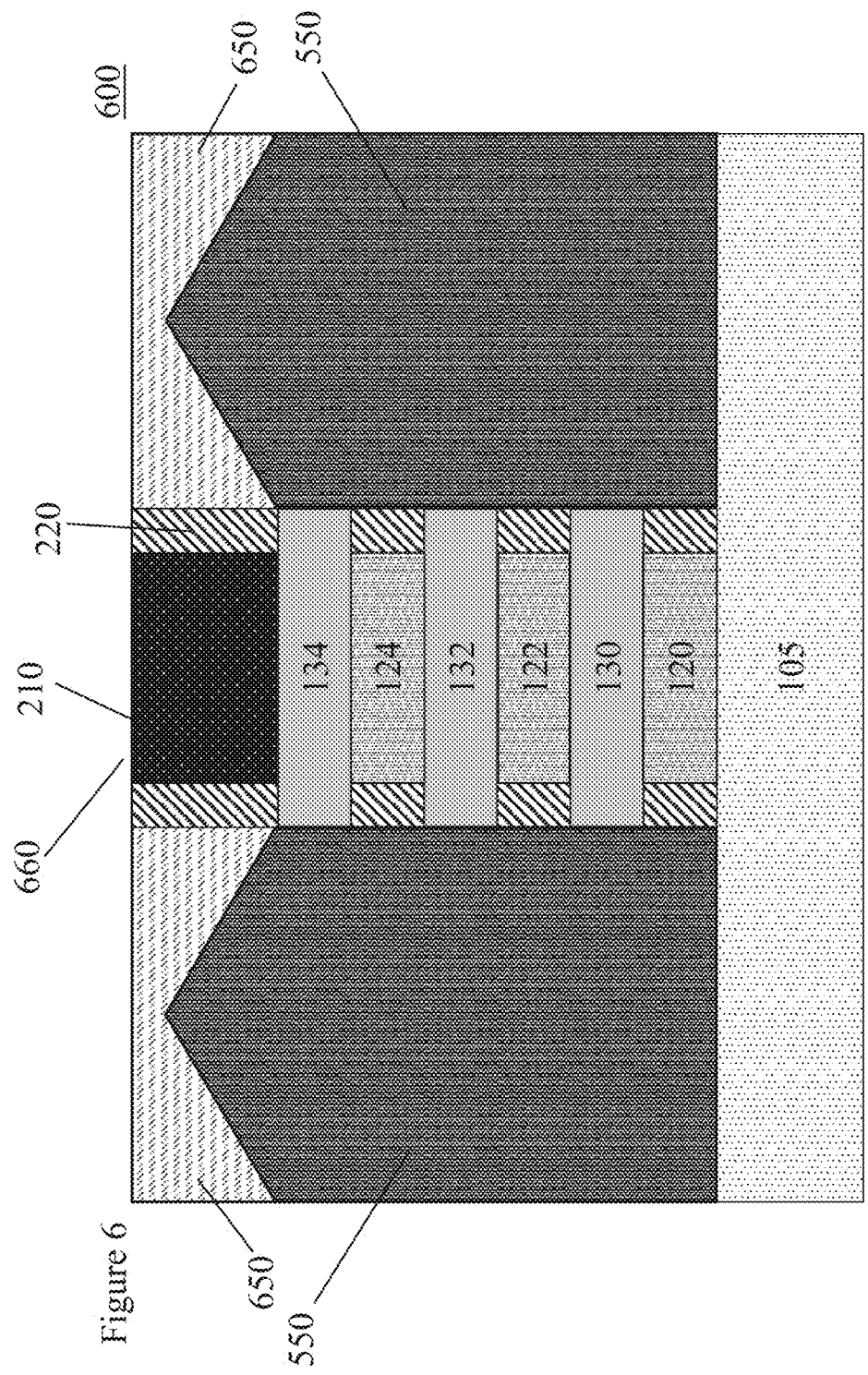
FIG. 6 is a cross-section view of an interim structure after an Interlayer Dielectric (ILD) deposition and a Chemical Mechanical Polishing (CMP).

FIG. 6 is a cross-section view of an interim structure 600 after an Interlayer Dielectric (ILD) 650 deposition and a Chemical Mechanical Polishing (CMP).

The ILD 650 may be formed from a low-k dielectric material (with k<4.0), including but not limited to, silicon oxide, spin-on-glass, a flowable oxide, a high-density plasma oxide, borophosphosilicate glass (BPSG), or any combination thereof. The ILD 650 is deposited by other deposition processes, including, but not limited to chemical vapor deposition (CVD), physical vapor deposition (PVD), plasma enhanced CVD, atomic layer deposition (ALD), evaporation, chemical solution deposition, or like processes.

The ILD 650 covers the structure 600 and envelops the S/Ds 550. However, the ILD 650 does not cover access from the front and/or back (out of and into the figure) of the all-around dummy gate layers (120, 122, 124, typically 160).

The structure 600 is planarized by known methods like Chemical Mechanical Polishing (CMP). In addition to smoothing the top surface of the structure 660, the CMP removes the top part of the gate spacer 220 and exposes the dummy gate 210 material.

Figure 7:
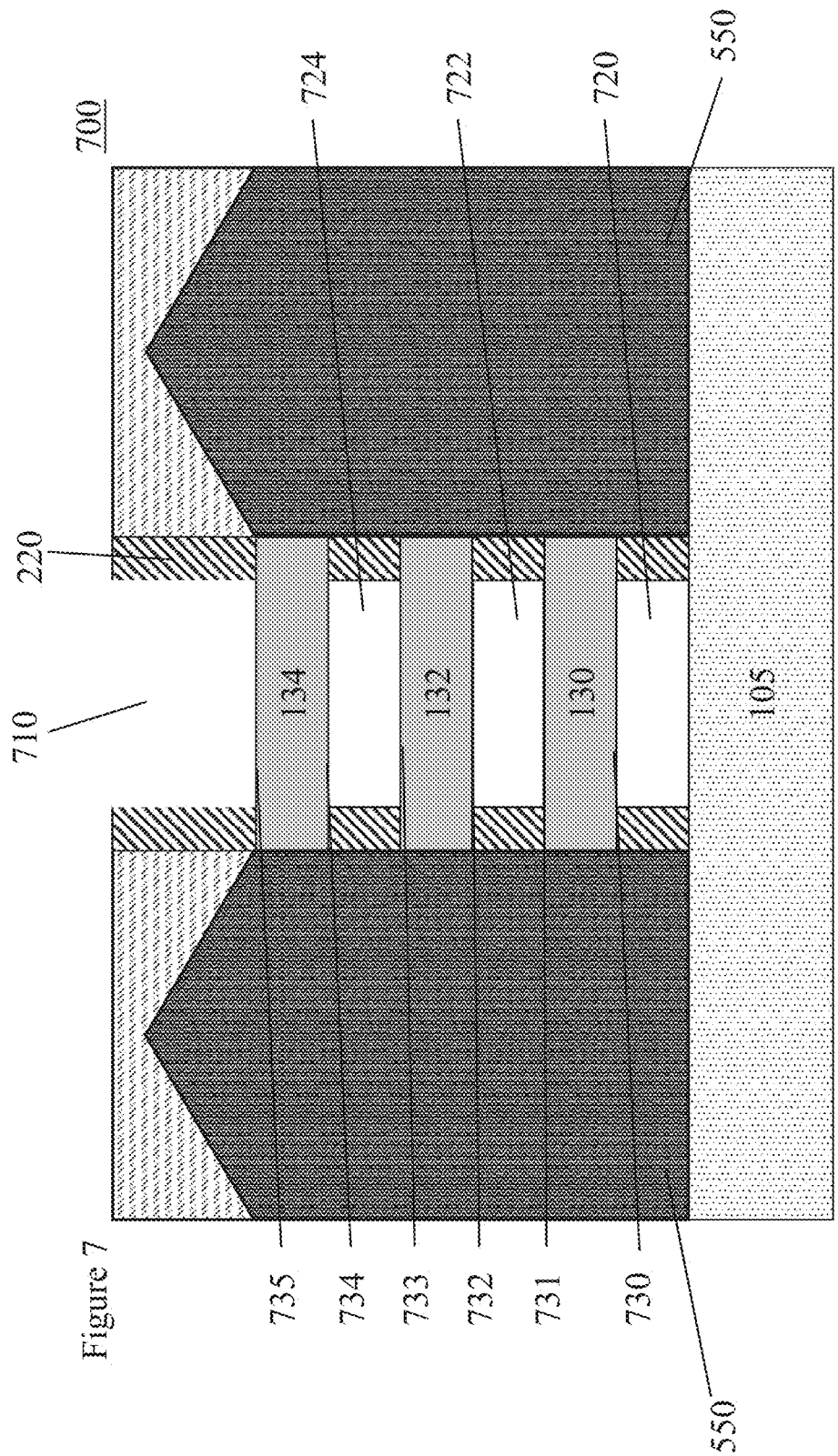
FIG. 7 is a cross-section view of an interim structure after removal of the top dummy gate and the all-around dummy gate material.

FIG. 7 is a cross-section view of an interim structure 700 after removal of the dummy gate 210 and the all-around dummy gate 160 material.

The material is removed by a release etch. In cases where the dummy gate 210 and the all-around dummy gate layers 160 are made of the same material, e.g. SiGe, only one release etch is required. In cases there the dummy gate 210 and the all-around dummy gate 160 are made of different materials, multiple release etches might be needed.

In some embodiments, the dummy gate 210 and the all-around dummy gates 160 are made of SiGe. In these conditions, the SiGe in the dummy gate 210 and all-around dummy gate 160 material (SiGe) between the channels 150 and inner spacers 450 can be selectively removed by a dry etch or exposure to ammonium hydroxide (NH$_4$OH) at higher than room temperature or exposure to a solution of hydrofluoric acid (HF).

The etching materials can access the dummy gate 210 from the top of the structure 700. The etching materials can access the materials in the all-around dummy gate 160 from the exposed sides on the front and back (not shown) of the structure 700.

The release etch leaves voids (720, 722, and 724) between the inner spacers 450. The tops (731, 733, and 735) and bottoms (730, 732, and 734), and fronts and backs—not shown, of the respective channels 130, 132, and 134 are also exposed.

Figure 8:
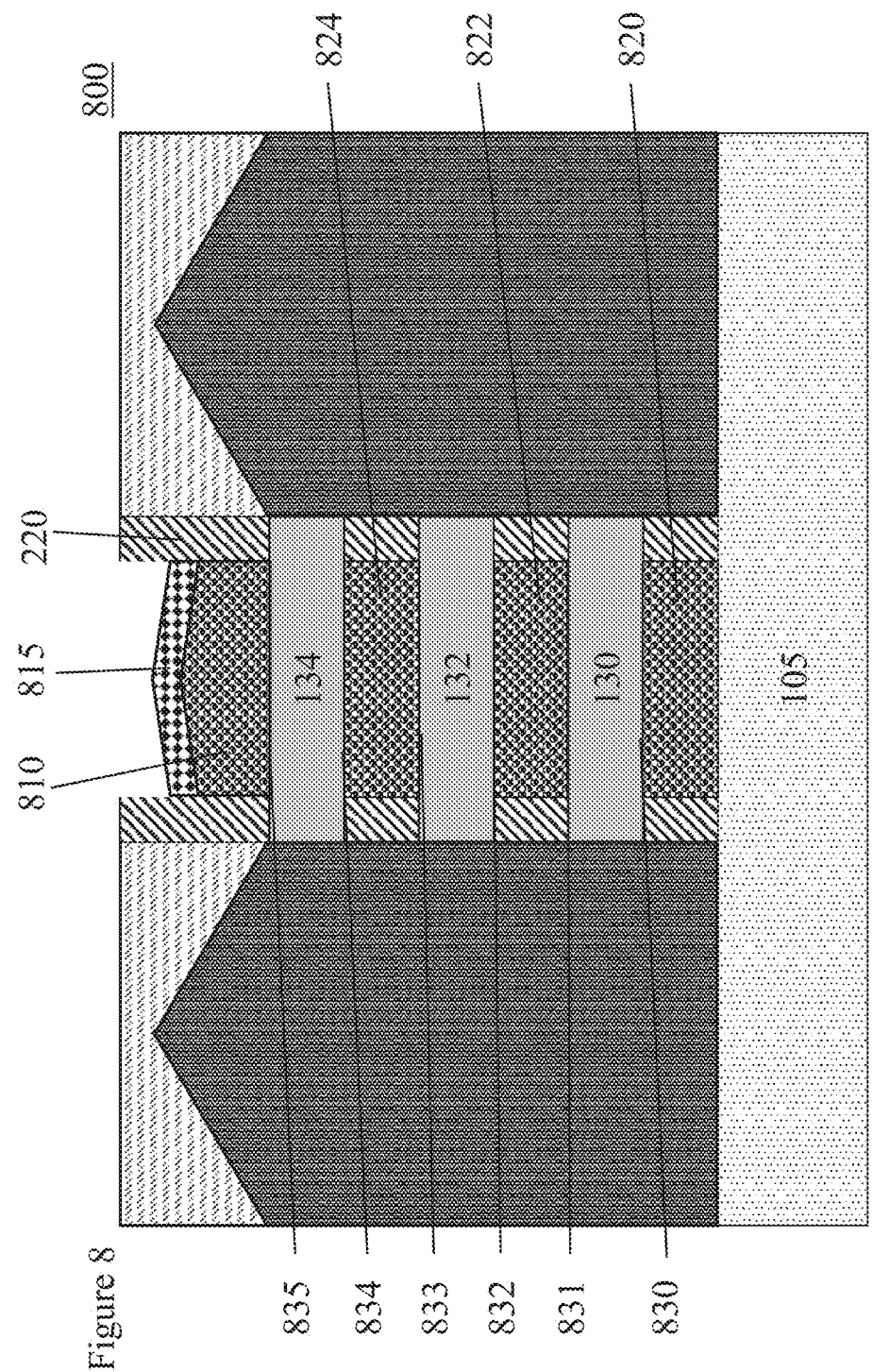
FIG. 8 is a cross-section view of an interim structure after epitaxially growing (top and all-around) gates and a capping layer.

FIG. 8 is a cross-section view of an interim structure 800 after epitaxially growing of the gates 810, 820, 822, and 824) and a capping layer 815.

The gates (810, 820, 822, and 824) have an opposite doping than the channels (130, 132, and 134). For example, if the channel, e.g. 130 is p-type doped, the gates 820 and 822 are n-type doped. The doping levels of the gates (810, 820, 822, and 824) are between $2\times10^{20}$ cm$^{-3}$ and $7\times10^{20}$ cm$^{-3}$. Higher and lower doping levels may be used as well.

Accordingly, a p-n junction (or junction gate) is created at each interface between the respective gate and the respective channel surface. For example, channel 130 has an upper surface 831 and a lower surface 830. Gate 822 is in direct contact with the upper surface 831 of channel 130 and forms an upper (p-n) junction gate and gate 820 is in direct contact with the lower surface 830 of channel 130 and forms a lower (p-n) junction gate. In like manner, gate 824 (810) is in direct contact with the upper surface 833 (835) of channel 132 (134) and forms an upper (p-n) junction gate and gate 822 (824) is in direct contact with the lower surface 832 (834) of channel 132 (834) and forms a lower (p-n) junction gate.

Note that each channel (130, 132, and 134) has an upper and lower junction gate on both the upper and lower surface of the respective channel (130, 132, and 134). In some embodiments, the gates (820, 822, 824, and 810) completely encompass the respective channels (130, 132, and 134) being in direct contact with the front and back surfaces (not shown) of the channels and forming a junction gate at these front and back interfaces as well.

When the gate, e.g. 820 and 822, completely surrounds (upper, lower, front, and back) the channel, e.g. 130, all parts of the gate (820, 822) are at one voltage potential, since the gate is a single contact. Therefore, the voltage applied to the gate, e.g. 820 and 822, causes an electric field in the channel with the same voltage potential applied at all the junction gates surrounding the channel.

In addition, each channel (130, 132, and 134) will have an electric field formed within the channel by the same voltage potential applied at all the junction gates surrounding the respective channel by their respective encompassing gates.

Further, in some embodiments, each of the gates (820, 822, 824, and 810) are formed as the same contact so that all the channels (130, 132, and 134) will have the same voltage potential applied at all the junction gates surrounding all the channels. In fact, some channels have common gates. For example, gate 822 (824) is the upper gate for channel 130 (132) and the lower gate for channel 132 (134).

Thus, this FET 800 has multiple channels (e.g., 130, 132, and 134) with each channel having both an upper and lower junction gate (and a front and back junction gate) formed at the direct contact with a respective channel surface, and where all the gates (upper and lower) are connected in common. As a result, a voltage applied to the junction gate terminal of the FET 800 will cause an electric field in each of the multiple channels (130, 132, and 134). Each of the channels will have at least two depletion regions, an upper depletion region and a lower depletion region (and alternatively, a front and back depletion region, as well).

In some embodiments, the structure 800 has multiple junction gates (830, 831, 832, 833, 834, and 835) that are parallel and stacked in a vertical direction (perpendicular to the substrate 105).

As explained more below, the upper and lower depletion regions enable current flow through each of the channels to be controlled (and turned off and on) with lower junction terminal voltage and lower input power to the device. Increasing the number of channels (e.g. 130, 132, and 134) increases the amount of current flowing between the source 550 and drain 550 of the device at a given junction gate terminal voltage, e.g. increasing the gain of the device.

The gates (820, 822, 824, and 810) are formed by epitaxial growth process like the one described above. The epitaxial growth continues until the voids (720, 722, 724) are filled with the gate material, e.g. doped silicon. Since the void 710 has no constrain on top, the gate 810 material can grow in this region 710 while maintaining a crystal-like surface.

At the point in the gate epitaxial growth process when the voids (720, 722, 724) are filled, the doping level is increased so a cap layer 815 of gate material with a higher doping level is formed. The cap layer 815 will be used later in the process to form a lower resistance metal contact to the all-around gates (820, 822, 824, and 810). The doping level of the cap layer 815 is between $1 \times 10^{20}$ cm$^{-3}$ and $2 \times 10^{21}$ cm$^{-3}$. Higher and lower doping levels may be used as well.

Figure 9:
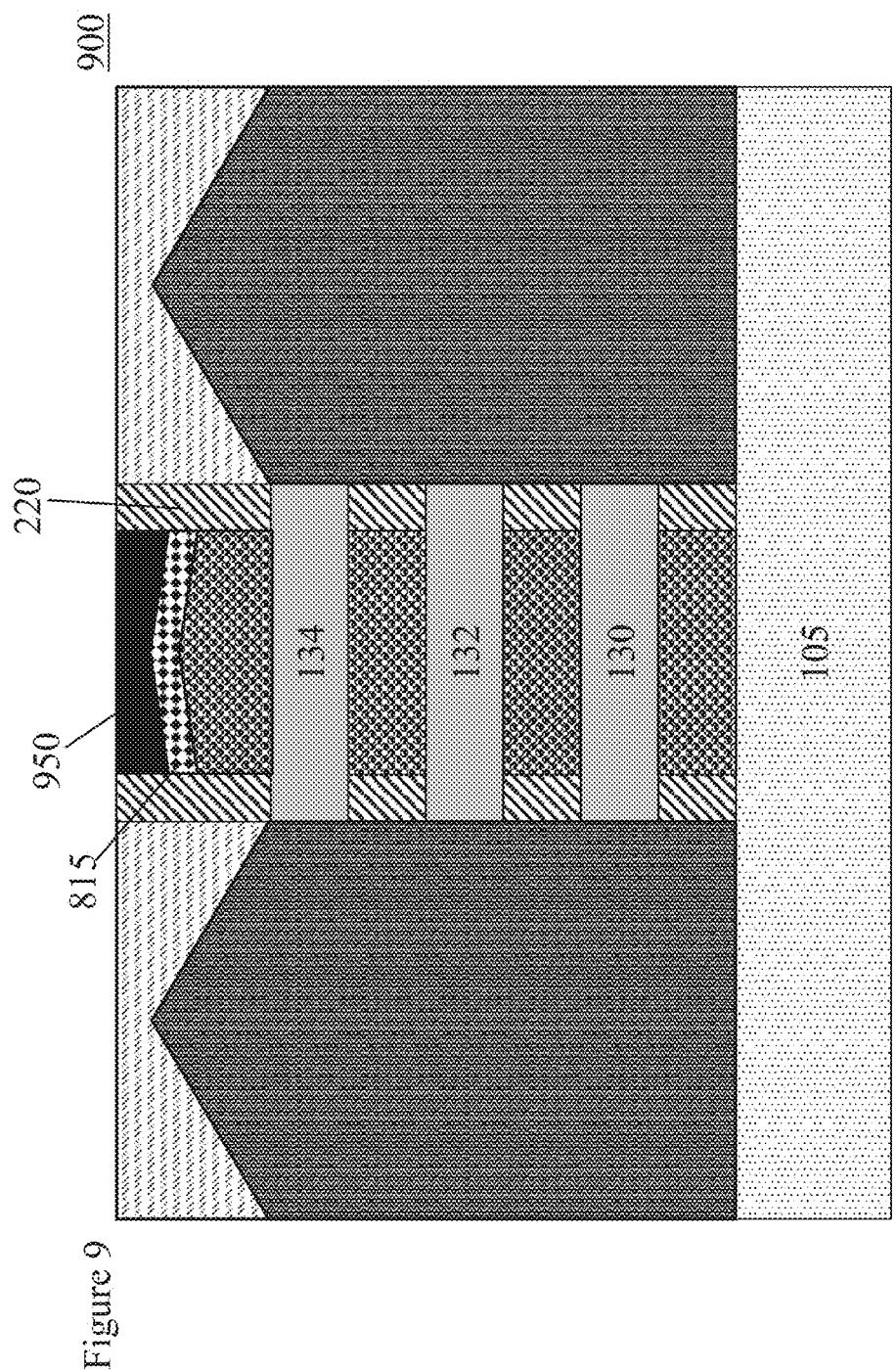
FIG. 9 is a cross-section view of a JFET structure after one embodiment of forming an external junction gate contact.

FIG. 9 is a cross-section view of a JFET structure 900 after one embodiment of forming an external junction contact 950.

In one embodiment, the space above the cap layer 815 and between the gate spacers 220 is filled with a conductive material 950 or a combination of conductive materials 950. The conductive material 950 may be a conductive metal like aluminum (Al), platinum (Pt), gold (Au), tungsten (W), titanium (Ti), Cobalt (Co) or any combination thereof. The conductive material may be deposited by a suitable deposition process, for example, CVD, PECVD, PVD, plating, thermal or e-beam evaporation, or sputtering.

Typically, prior to deposition of the conductive metal 950, a metal silicide contact is formed on the surface of the cap layer 815 by a well-known salicide formation process. (An example known silicide formation process includes depositing a metal (like Ni), followed by an annealing, e.g. between 410 and 425 degrees Celsius for about 15 minutes, and then removing of the unreacted metal.)

Figure 10:
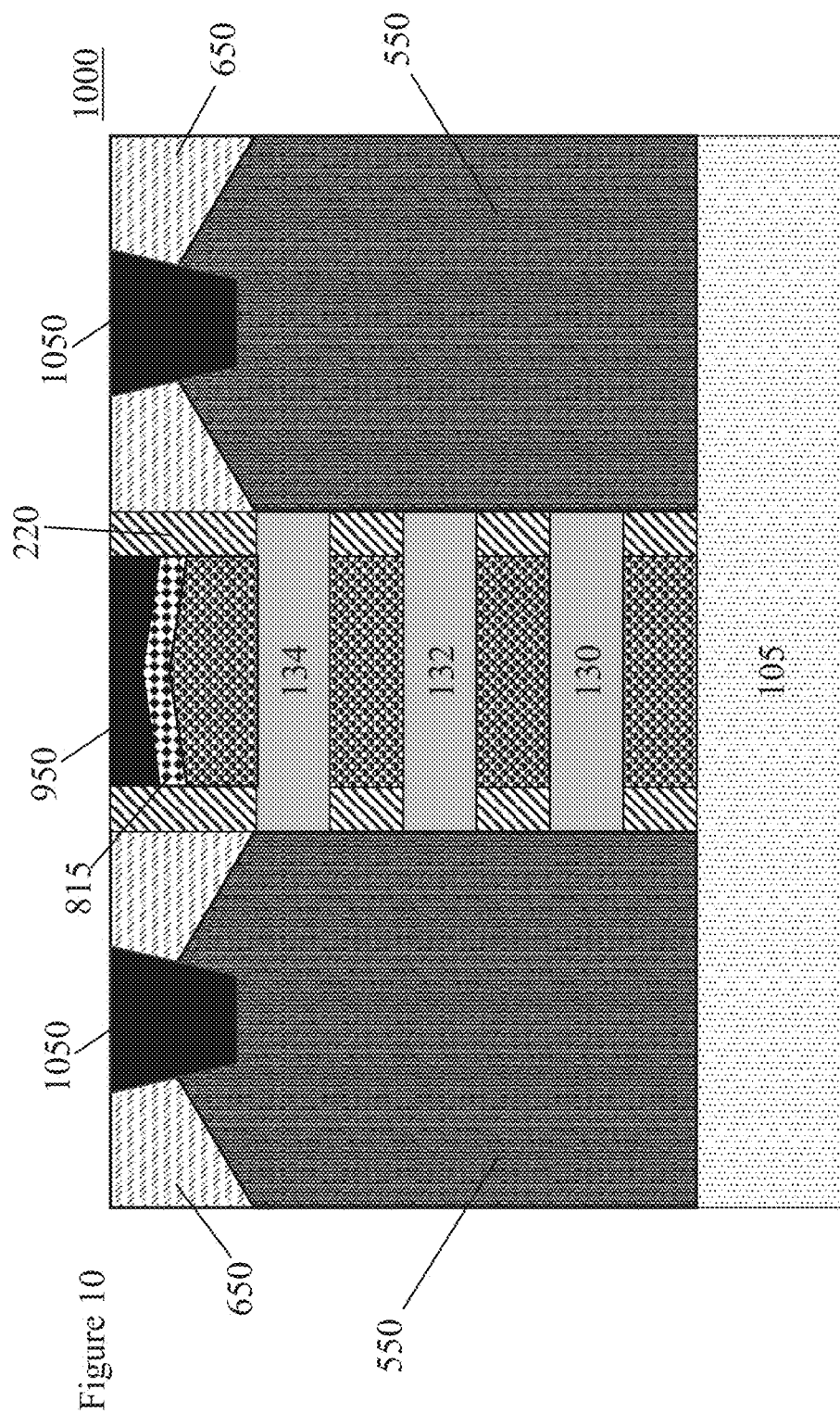
FIG. 10 is a cross-section view of a JFET structure after an alternate embodiment of forming an external junction gate contact and formation of external source/drain contacts.

FIG. 10 is a cross-section view of a JET structure 1000 after formation of external source/drain contacts 1050.

In some embodiments, openings/trenches to the S/D 550 are made through the ILD 650 using lithographic techniques. A silicide layer is then formed on the exposed surface of the S/D 550. A conductive material 1050 is deposited to fill the openings/trenches that forms an external electrical contact to each of the S/D 550.

The conductive material 1050 can be the same type of material and applied with the same techniques as the external junction contact 950.

In alternative embodiments, the openings/trenches to the S/D 550 are etched first, the silicide formation is done simultaneous on both the open S/D surfaces and the cap layer 815, and the conductive material (950 and 1050) for all three external contacts is deposited at the same time. A CMP may be performed to level the surface of the JFET structure 1000.

Figure 11:
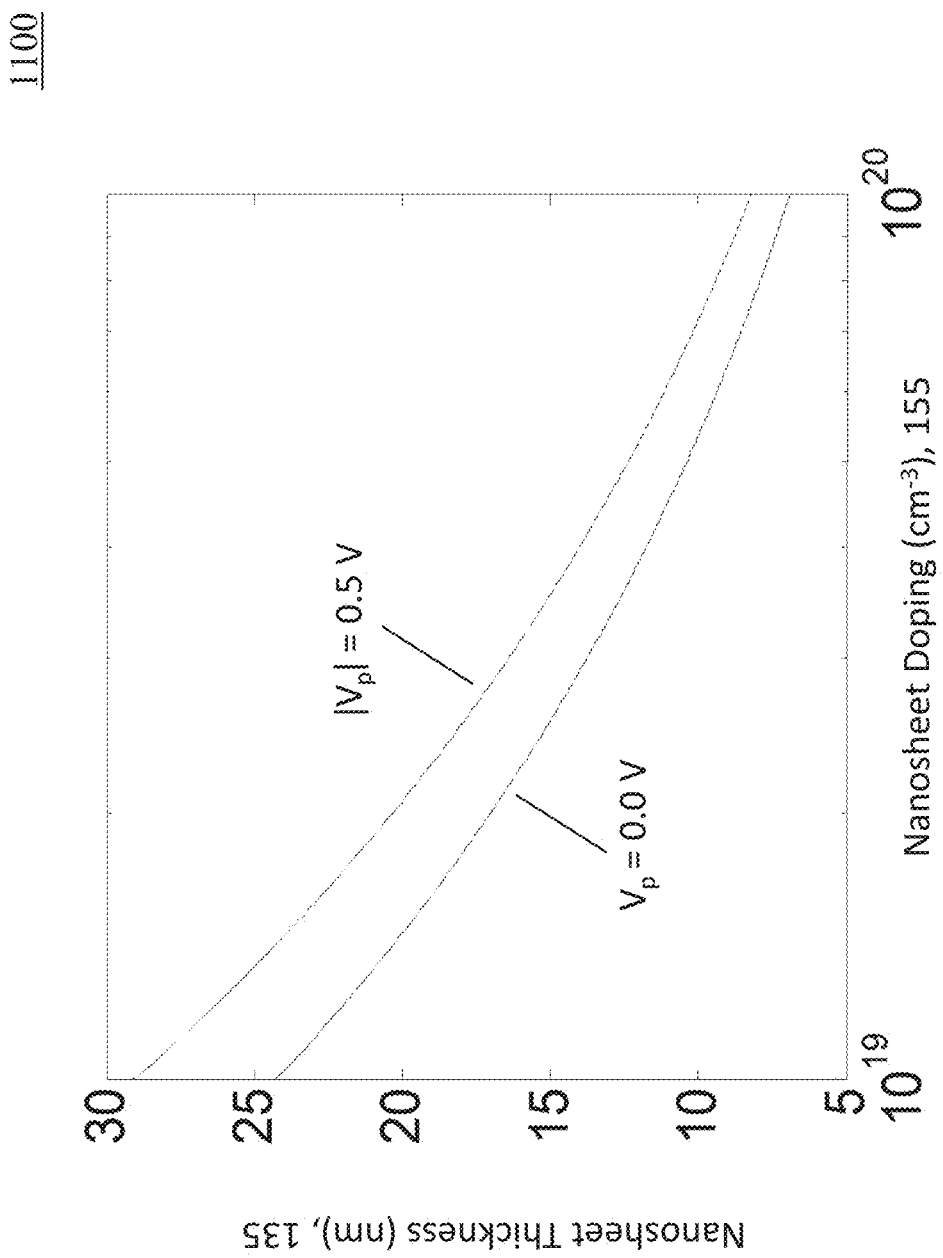
FIG. 11 is a graph showing a channel thickness variation versus nanosheet layer doping.

FIG. 11 is a graph 1100 showing a channel thickness 135 variation versus nanosheet layer doping 155.

Desired nanosheet channel thickness 135 vs. doping 155 of the respective channel layer 150 can be estimated using known relationships provided below. The equations presented below are first order relationships and do not include band gap narrowing effects. Known higher order equations may be used for more accurate estimates if desired.

Results are presented for calculated contours for two constant values of $V_p$, a first contour for $V_p$=0.0 V and a second contour for $|V_p|$=0.5V. Subthreshold circuits can operate at or around $V_p$=0 V. Pinch-off voltage ($V_p$) is defined as the minimum gate-source voltage ($V_{GS}$) required to fully deplete the channel 150.

Among other things, the depletion region width, $W_p$, in a channel (130, 132, 134) depends on doping density 155 in the channel ($N_A$ for p-channel and $N_D$ for n-channel JFET), doping density ($N_D$ for p-channel and $N_A$ for n-channel JFET) in the gates (810, 820, 822, and 824) forming the junction gates (830, 831, 832, 833, 834, and 835), and the intrinsic carrier concentration, $n_i$, which is dependent on material type and operating temperature.

Note that in the present invention the depletion region width, $W_p$, that is needed to reach pinch-off voltage ($V_p$), is divided by 2 or more because there are at least two gates (810, 820, 822, and 824), e.g. an upper and a lower gate, that are in direct contact with surfaces of each channel (130, 132, 134). Thus, the voltage applied to the external gate connection of the present invention can be ½ or less than that of a device with a single junction gate on a channel.

In alternative embodiments, the width 135 of the channel can be increase by 2 or more times the depletion region width, $W_p$, so that twice the S/D current flow can be controlled the same gate-source voltage ($V_{GS}$) used in a single junction gate device.

One calculation of channel depletion region width is as follows:

$$V_{bi}=(kT/q)\ln(N_A N_D/n_i)$$

where:
$V_{bi}$=built-in potential,
k=Boltzmann constant,
T=absolute temperature of the device 1000,
$N_A$=acceptor-type doping density,
$N_D$=donor-type doping density, and
$n_i$=intrinsic carrier concentration.

$$W=\{[2\epsilon(V_{bi}-|V_{GS}|)/q][(N_A+N_D)/N_A N_D]\}^{1/2}$$

where $|V_{GS}|$ refers to absolute value of $V_{GS}$
where:
W=depletion region width, and
$\epsilon$=dielectric constant of the channel material, e.g. Si.

$$W_p=WN_D/(N_A+N_D) \text{ for } p\text{-channel JFET}$$

$$W_p=WN_A/(N_A+N_D) \text{ for } n\text{-channel JFET}$$

where $W_p$=the depletion region width in channel associated with a given gate junction.

The graph in FIG. 11 is for the case where $N_D$. where the doping density in gate is $3 \times 10^{20}$ cm$^{-3}$. For a p-channel JFET (where the gate is doped with an n-type dopant and the channel and S/D are doped with a p-type dopant), $V_p$=0.5V, whereas for an n-channel JFET (where the gate is doped with a p-type dopant and the channel and S/D are doped with an n-type dopant), $V_p$=−0.5V.

Figure 12:
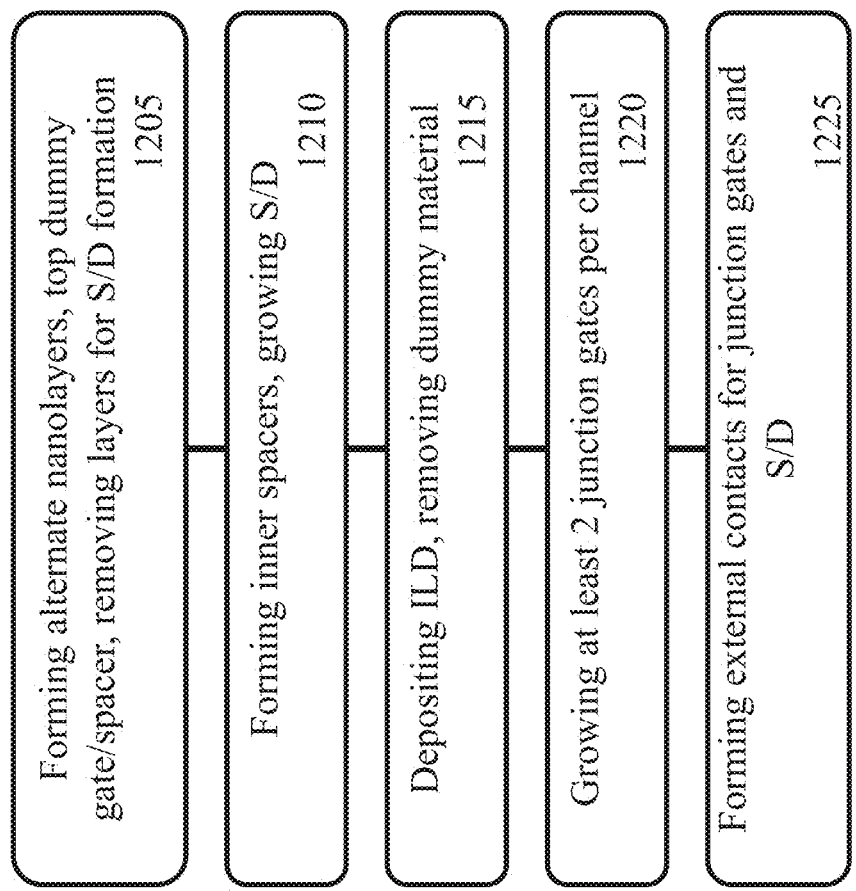
FIG. 12 is a flow chart with method steps of making a JFET with an all-around junction gate.

FIG. 12 is a flow chart with method 1200 steps of making a JFET with an all-around junction gate.

The method begins with step 1205 by forming the alternate nanolayers 140, depositing the top dummy gate 210 and gate spacer 220, and removing material to prepare for the formation of the S/D 550.

In step 1205 two or more nanosheet layers 140 are epitaxially grown. Each of the layers 140 is disposed upon one another. Some of the nanosheet layers 140 are channel layers 150 and some of the nanosheet layers 140 are all-around dummy gate layers (dummy layers) 160. The channel layers 150 are doped with a channel layer doping 155 with a channel layer doping type. The channel layers 150 and dummy layers 160 alternate. Some of the nanosheet layer 140 material is removed to create a source region 310 and a drain region 320.

Inner spacers 450 are formed on the ends of the remaining dummy layers 160 in step 1210.

In step 1210, the source and drain (S/D) 550 are epitaxially grown so the channel layers (130, 132, 134) are electrically connected in parallel between the S/D 550. The S/D 550 is doped with a S/D doping with an S/D doping type. The S/D doping type is the same type as the channel layer doping type.

Depositing the ILD 650 and removing the dummy gate material (210, 120, 122, and 124) occurs in step 1215. Removing the dummy layers 160 exposes two or more channel surfaces (730, 731, 732, 733, 734, and 735) on each of the channels (130, 132, and 134).

The junction gates (810, 820, 822, and 824) are epitaxially grown in step 1220. The junction gates are doped with a gate doping. The gate doping has a gate doping type opposite of the channel layer doping type. A junction gate is formed at each channel surface in direct contact (830, 831, 832, 833, 834, and 835) with one of the gates (820, 822, 824).

In step 1225, the external contacts (950, and 1050) are formed, connecting an external contact (950 and 1050, respectively) to each S/D 550 and the gate(s) (810, 820, 822, and 824).

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. For example, the semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, etc. Systems and hardware incorporating the semiconductor devices are contemplated embodiments of the invention.

The terminology used herein was chosen to explain the principles of the embodiments and the practical application or technical improvement over technologies found in the marketplace or to otherwise enable others of ordinary skill in the art to understand the embodiments disclosed herein. Devices, components, elements, features, apparatus, systems, structures, techniques, and methods described with different terminology that perform substantially the same function, work in the substantial the same way, have substantially the same use, and/or perform the similar steps are contemplated as embodiments of this invention.

We claim:

1. A Junction Field Effect Transistor (JFET) comprising:
   a substrate;
   a source disposed on the substrate, the source having an S/D doping, the S/D doping having an S/D doping type;
   a drain disposed on the substrate, the drain having the S/D doping type;
   two or more channels electrically connected in parallel between the source and drain and capable of carrying a current between the source and drain, each of the channels having two or more channel surfaces, the channel having a channel doping with a channel doping type, the channel doping type being the same as the S/D doping type, where the channels are made of nanosheet layers and a channel layer thickness is between 5 nanometers (nm) and 30 nm;
   a first gate in direct contact with a first channel surface, the first gate having a gate doping with a gate doping type, the gate doping type being an opposite doping to the channel doping type;
   one or more second gates each in direct contact with a respective second channel surface, the second gates being doped with the gate doping type,
   gate spacers spaced lateral from the first and second gates;
   wherein the first and second gates are electrically connected so a voltage applied to the first and second gates creates at least two depletion regions in each of the channels, a first depletion region of the at least two depletion regions being on one or more of the first channel surfaces and a second depletion region of the at least two depletion regions being on one or more of the second channel surfaces;
   where: the first gate and the one or more second gates form an all-around gate of a single unified structure; and
   wherein an outermost one of the first and second gates has an outermost point that does not extend as far outward as an outermost point of the source, an outermost point of the drain, and an outermost point of the gate spacers.

2. A JFET, as in claim 1, where increasing the number of channels increases a maximum amount of current that flows between the source and drain.

3. A JFET, as in claim 1, where there is a p-n junction formed where each of the first gates and second gates are in direct contact with each respective channel surface.

4. A JFET, as in claim 1, where the gate doping type is p-type and the channel doping type in n-type.

5. A JFET, as in claim 1, where the gate doping type is n-type and the channel doping type in p-type.

6. A JFET, as in claim 1, where the S/D doping is between $4 \times 10^{20}$ cm$^{-3}$ and $2.5 \times 10^{21}$ cm$^{-3}$.

7. A JFET, as in claim 1, where the channel doping is between $1 \times 10^{19}$ cm$^{-3}$ and $3 \times 10^{20}$ cm$^{-3}$.

8. A JFET, as in claim 1, where the gate doping is between $2 \times 10^{20}$ cm$^{-3}$ and $7 \times 10^{20}$ cm$^{-3}$.

9. A Junction Field Effect Transistor (JFET) comprising:
a substrate;
a source disposed on the substrate, the source having an S/D doping, the S/D doping having an S/D doping type;
a drain disposed on the substrate, the drain having the S/D doping type;
two or more channels electrically connected in parallel between the source and drain and capable of carrying a current between the source and drain, each of the channels having two or more channel surfaces, the channel having a channel doping with a channel doping type, the channel doping type being the same as the S/D doping type;
a gate in direct contact with two or more of the channel surfaces of each of two or more of the channels, the gate having gate doping with a gate doping type, the gate doping type being an opposite doping to the channel doping type, and the gate forming a junction gate at each channel surface where the gate is in direct contact,
gate spacers spaced lateral from the gate;
wherein:
  a voltage applied to the gate creates at least two depletion regions in all of the channels, a first depletion region created at a first channel surface where the gate is in direct contact and a second depletion region created at a second channel surface where the gate is in direct contact;
  the channels are made of nanosheet layers and a channel layer thickness is between 5 nanometers (nm) and 30 nm;
  the gate is an all-around gate of a single unified structure; and
  an outermost point of the gate does not extend as far outward as an outermost point of the source, an outermost point of the drain, and an outermost point of the gate spacers.

10. A JFET, as in claim 9, where the SID doping is higher than the channel doping.

11. A JFET, as in claim 9, where there are 3 or more channels.

12. The HET, as in claim 1, where the source, drain, and channels are made of the same semiconductor material.

13. The JFET, as in claim 1, where an electric field in each of all of the channels is created by the same applied voltage.

14. The NET, as in claim 1, where one or more of the gates has a gate thickness between 6 nm and 20 nm.

* * * * *